(12) United States Patent
Mäntyjärvi et al.

(10) Patent No.: US 7,212,835 B2
(45) Date of Patent: May 1, 2007

(54) CONTROLLING A TERMINAL OF A COMMUNICATION SYSTEM

(75) Inventors: Jani Antero Mäntyjärvi, Oulu (FI); Antti Ilkka Takaluoma, Ii (FI); Urpo Jalmari Tuomela, Oulu (FI)

(73) Assignee: Nokia Corporation, Espoo (FI)

( * ) Notice: Subject to any disclaimer, the term of this patent is extended or adjusted under 35 U.S.C. 154(b) by 718 days.

(21) Appl. No.: 09/737,033

(22) Filed: Dec. 14, 2000

(65) Prior Publication Data

US 2001/0044318 A1 Nov. 22, 2001

(30) Foreign Application Priority Data

Dec. 17, 1999 (GB) .................................... 9929951

(51) Int. Cl.
*H04M 1/00* (2006.01)

(52) U.S. Cl. ............................... 455/550.1; 455/475.1; 379/429

(58) Field of Classification Search ............... 455/90.3, 455/344, 575.1, 550.1; 379/428.01, 429, 379/430, 433.01
See application file for complete search history.

(56) References Cited

U.S. PATENT DOCUMENTS

| | | | | |
|---|---|---|---|---|
| 5,010,566 | A | | 4/1991 | Seo .............................. 379/61 |
| 5,329,577 | A | * | 7/1994 | Norimatsu ................... 455/567 |
| 5,740,523 | A | * | 4/1998 | Nakajima et al. .......... 455/186.1 |
| 5,802,467 | A | * | 9/1998 | Salazar et al. ............... 455/420 |
| 5,818,701 | A | * | 10/1998 | Shindo ........................ 361/814 |
| 5,881,377 | A | * | 3/1999 | Giel et al. ................. 455/343.1 |
| 5,930,703 | A | * | 7/1999 | Cairns ........................ 455/418 |
| 6,121,881 | A | * | 9/2000 | Bieback et al. ........... 340/573.1 |
| 6,246,862 | B1 | * | 6/2001 | Grivas et al. ................ 455/566 |
| 6,292,674 | B1 | * | 9/2001 | Davis ....................... 455/550.1 |
| 6,360,104 | B1 | * | 3/2002 | Budd et al. .................. 455/566 |
| 6,377,818 | B2 | * | 4/2002 | Irube et al. ............... 455/556.1 |
| 6,560,468 | B1 | * | 5/2003 | Boesen ..................... 455/569.1 |
| 6,912,287 | B1 | * | 6/2005 | Fukumoto et al. .......... 381/151 |

(Continued)

FOREIGN PATENT DOCUMENTS

DE 44 22 260 6/1994

(Continued)

OTHER PUBLICATIONS

Japanese Patent document No. JP10190786- with English translation of the Abstract.

(Continued)

*Primary Examiner*—Edward F. Urban
*Assistant Examiner*—Nhan T. Le
(74) *Attorney, Agent, or Firm*—Perman & Green, LLP

(57) ABSTRACT

The present invention relates to a terminal for a communication system. The terminal comprises detector means that are arranged to detect if there is a contact between at least one surface of the terminal and the skin of the user of the terminal. The detection means comprise at least two different detector arrangements for detecting a contact between the terminal and the user. The detector arrangements each comprise independently operating sensor means (7, 8, 30). At least one function of the terminal is arranged to be controlled based on a signal generated by the detecting means in response to the detection. The invention relates further to a detector arrangement for a communications terminal and a method for controlling a communications terminal.

28 Claims, 3 Drawing Sheets

U.S. PATENT DOCUMENTS

2001/0027121 A1* 10/2001 Boesen .................. 455/556
2005/0043056 A1* 2/2005 Boesen .................. 455/550.1

FOREIGN PATENT DOCUMENTS

| DE | 196 38127 A1 | 2/1998 |
| EP | 0 381 214 A3 | 8/1990 |
| EP | 0 629 981 A1 | 12/1994 |
| EP | 0 912 031 A2 | 4/1999 |
| GB | 2 222 747 A | 3/1990 |
| GB | 2327321 A | 1/1999 |
| WO | WO 99/34574 | 7/1999 |

OTHER PUBLICATIONS

Japanese Patent document No. JP09321830- with English translation of the Abstract.

* cited by examiner

Detect a contact between a MS and user's hand by at least two different detector arrangements

↓

Based on indications from the at least two detector arrangements that the MS is in contact with the user's hand, generate a signal indicating that the MS is in the hand of the user

↓

Input the signal into a controller and control a function of the MS based on the signal

CONTROLLING A TERMINAL OF A COMMUNICATION SYSTEM

FIELD OF THE INVENTION

The present invention relates to controlling of at least one function of a terminal of a communication system.

BACKGROUND OF THE INVENTION

In a communication system a terminal is used for providing a user interface for the user of the communication system. In other words, by means of the terminal the user may access and communicate over the communication system.

An example of the terminal is a mobile station that may be used in a radio communication system. The mobile station is typically a portable hand-held device that provides, in cooperation with the radio communication system, mobility for the user. When the mobile station is not in use, it is usually positioned in the user's pocket or in a special case or similar. The mobile station typically comprises a keypad for controlling the operation thereof, such as for dialing in a desired telephone number and for controlling various functions of the mobile station. A mobile station is also typically provided with a display. The display may be used for showing various information to the user of the mobile station. Instead of being an entirely hand-held unit, a mobile station may also comprise separate units, such as a base transceiver unit and a separate handset portion and/or a separate headset portion.

Another example is a user terminal for a fixed line communication system. Similarly to the mobile station, the fixed line user terminal, such as a conventional telephone apparatus, typically comprises keys or buttons for the control operations. In addition, a fixed line terminal typically comprises a "hook" that senses whether a separate handset portion and/or a headset portion is placed on the hook indicating that the terminal is not in use. Handheld fixed line terminals that are in the form of a single unit are also known.

The user typically controls the operation and/or functions of the terminal by pressing appropriate buttons on a keyboard of the terminal or by lifting the handset off-hook/placing the handset on-hook or opening/closing a specific cover connected to a switch and so on. Voice activated control systems are also known. For example, when the user wishes to establish a call, he usually selects or fetches the desired destination number by pressing appropriate keys on the keyboard or he may use possible voice activation functions of the terminal. When the user receives a call, the call is typically answered by lifting the handset off-hook, or by pressing at least one key of the keyboard or by opening the special cover of the keyboard. Similarly, any other functions of the terminal may be controlled by pressing appropriate keys or moving one or several components of the terminal to operate an associated switch. The functions and/or operations that need to be controlled may be functions such as switching the terminal between different modes of operation, controlling a keyboard lock or display of the terminal, switching on/off the lightning of the keyboard or the display, or controlling any other special features of the terminal or services provided for the user of the terminal (such as voice mail, short text messages, calendar or alarm functions and so on).

As mentioned above, a mobile station may be provided with a keyboard lock. The basic idea of the keypad or keyboard lock is to prevent the user to mistakenly press any of the keys when this is not desired (e.g. when the mobile station is in the pocket of the user). For example, by means of the lock it is possible to prevent an accidental call establishment to a telephone number that is not actually selected. The keyboard lock may be controlled in alternative ways. According to one possibility predefined keys of the keypad can be used for locking and unlocking the keypad of the mobile station. According to an alternative the closing and opening of a special keypad cover will lock and unlock the keys accordingly.

Whenever the user wishes to control a function of the terminal, he needs to perform a predefined act. For example, when answering a call terminating at a mobile station, it is typically required that the user presses a predefined button or opens a cover of the keyboard or even both. The users may, however, feel the use of the present control arrangements uncomfortable/time consuming. They may also forget to use functions such as the keyboard lock. There are also occasions where automatic control between different modes of operation of the terminal might be desired.

It has been proposed that the terminal is provided with means for detecting a contact between the user's skin and the surface of the mobile station. A prior art proposal is based on use of galvanic skin response (GSR) method. Although these methods have provided e.g. an automated answer to an incoming call, the inventors have found that these contact detection methods may in some instances result in incorrect and/or unwanted operation of the terminal. For example, sensing arrangement based on the galvanic skin response (GSR) may give an output signal when there is some other conductive material than the human skin in touch with the sensing electrodes of the arrangement. The conductive material could be water, dust, a conductive textile, a conductive surface (such as the surface of a table) and so on. Therefore there may be, in some circumstances, a possibility to get an incorrect output signal from the detector arrangement. Other possible detector arrangement, such as a close proximity (CP) detectors may also give false signals, for example when there is a very thin textile between the electrode and the human skin.

SUMMARY OF THE INVENTION

It is the aim of the embodiments of the present invention to address one or several of the disadvantages of the prior art terminals and to provide a solution for controlling one or several functions of a terminal.

According to one aspect of the present invention, there is provided a terminal for a communication system, the terminal comprising a first detector arrangement and a second detector arrangement, said first and second detector arrangements being based on different principles of detecting a contact between at least one surface of the terminal and the skin of the user of the terminal, wherein at least one function of the terminal is controlled based on signals from the first and second detector arrangements.

The control of the terminal that is based on the signal from the detector means is preferably provided only if said first and second detector arrangements both output a signal that indicates a contact between the terminal and the skin of the user.

According to another aspect of the present invention, there is provided a detector arrangement for a terminal of a communication system, the terminal comprising at least one element that is to be held against the skin of the user of the terminal, the detector arrangement comprising a first detector arrangement and a second detector arrangement, said first and second detector arrangements being based on different principles of detecting a contact between the terminal and the skin of the user, and circuitry adapted for generating an output signal based on signals from the first and second detector arrangements when the terminal touches in a predefined manner the skin of the user, the output signal being arranged to be employed in the control of at least one function of the terminal.

According to another aspect of the present invention, there is provided a method of controlling at least one function of a terminal of a communication system, comprising the steps of: detecting a contact between the terminal and the skin of the user of the terminal by means of a first detector arrangement; detecting a contact between the terminal and the skin of the user of the terminal by means of a second detector arrangement, said second detector arrangement being different from the operational principles thereof from the first detector arrangement; based on signals from the first and second detector arrangements, generating an output signal indicating that the surface of the terminal is in contact with the skin of the user; and controlling said at least one function of the terminal based on the output signal.

The embodiments of the invention may provide an automated and reliable control of at least one function, such as the keyboard lock and/or switching between different modes of operation of the terminal (e.g. standby and activated) and/or special service or feature. The embodiments may make the use of the terminal more convenient. The embodiments may prevent any unwanted and/or accidental activation of one or several of the functions of the terminal while the terminal is not in use.

BRIEF DESCRIPTION OF DRAWINGS

For better understanding of the present invention, reference will now be made by way of example to the accompanying drawings in which.

DESCRIPTION OF PREFERRED
EMBODIMENTS OF THE INVENTION

Figure 1:
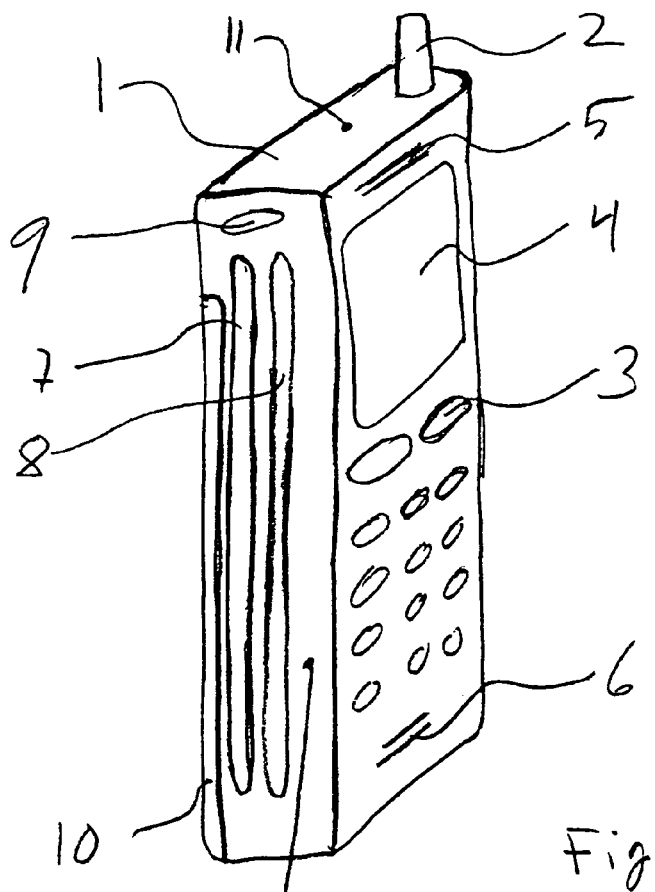
FIG. 1 shows one embodiment of the present invention.

FIG. 1 shows a mobile station in accordance with an embodiment of the present invention. The mobile station 1 comprises a housing or cover portion 11 which protects and encapsulates the various internal components of the mobile station. The internal components are not shown in greater detail, but may typically comprise components such as a processor 12 that is for controlling one or several functions of the mobile station. The mobile station 1 also comprises transceiver means (not shown) for receiving and transmitting a radio signal through an antenna 2, possible circuit boards, lightning components and other internal components known in the art. The cover or housing 11 is usually of plastic material, but other materials may also be used.

The terminal 1 comprises further a keypad 3. The keypad typically comprises several buttons such as "on-hook" and "off-hook" keys (sometimes referred to as "yes" and "no" keys) and keys for numerals from zero to nine. The keys can also be used for typing in alphabetic characters, such as for typing in short text messages and inputting names and numbers into a telephone number memory and/or entries into diaries or other special functions provided by the mobile terminal. The mobile station 1 may also comprise a separate power switch 9.

The mobile station 1 comprises also a display 4. The display may be used for displaying various messages and information to the user. The user may also use the display for the control operations of the mobile station, e.g. such that the uses the keys 3 for the selection of an appropriate function from a menu displayed to him by the display 4. The mobile station 1 may also be provided with a loudspeaker 5 and a microphone 6. A battery 10 is detachably attached onto the back side of the mobile station 1.

In accordance with a preferred embodiment two strip electrodes 7 and 8 are shown to be attached on one side of the mobile station 1. The electrodes 7 and 8 are employed for detecting a contact between the skin of the user and the mobile station. Second means for detecting a contact between the mobile station 1 and the user are also provided. However, in the FIG. 1 terminal these are provided on the backside of the mobile station 1, and are thus not visible.

According to a possibility the electrodes 7 and 8 are attached on the outer surface of the housing 11 of the mobile station 1. The electrodes may also be embedded in the cover material such that the surface of the electrodes will remain visible and may thus be touched by the skin of the user.

Figure 2:
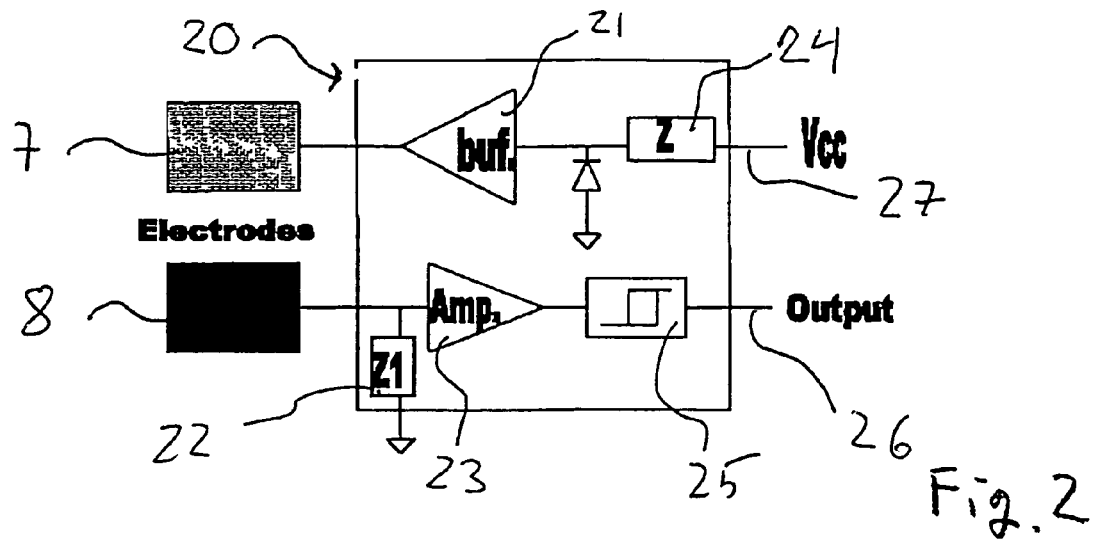
FIG. 2 is a schematic illustration of galvanic touch sensor circuitry.

More particularly, the electrodes 7 and 8 may be arranged to measure so called galvanic skin response (GSR). FIG. 2 discloses a block diagram for circuitry that may be used when implementing a galvanic skin response touch sensing arrangement 20. The first electrode 7 is coupled to a voltage source Vcc via a line 27. The voltage Vcc may equal the operational voltage of the mobile station, but Vcc may also be different from that. Voltage Vcc is preferably provided by the battery 10 of the mobile station 1. A buffer 21 and an appropriate impedance 24 may be provided for scaling the current and voltage on the line 27 between the electrode 7 and the voltage source Vcc. The second electrode 8 is coupled to an output 26 of the circuitry 20. The signal from the electrode 8 may be amplified by an amplifier 23 before the signal is output from the circuitry 20. The amplifier circuit may comprise a resistor/impedance 25.

The galvanic skin response (GRS) detection method is based on provision of a conductive path between two or more electrodes. When the user grips the mobile station 1 by his hand (not shown), the skin of the hand will provide the conductive path between the electrodes 7 and 8 of FIGS. 1 and 2. Now, when a conductive path is provided between the electrodes 7 and 8, the voltage and current at the output line 26 will change in accordance with known principles. The GSR sensing arrangement 20 gives typically so-called TTL level (transistor to transistor logic level) output signal when the conductive material is in touch with at last two of the electrodes. A component 22 may be used for setting an appropriate threshold level for the conductivity, i.e. the component 22 may trigger the circuitry 20 to output a signal that indicates a contact between the hand of the user and the mobile station 1.

The electrodes or sensors can be arranged in many alternative ways on the surface of the mobile station 1. For example, one of the electrodes could be positioned on one side surface of the station like the electrode 7 (or 8) of FIG.

Figure 3:
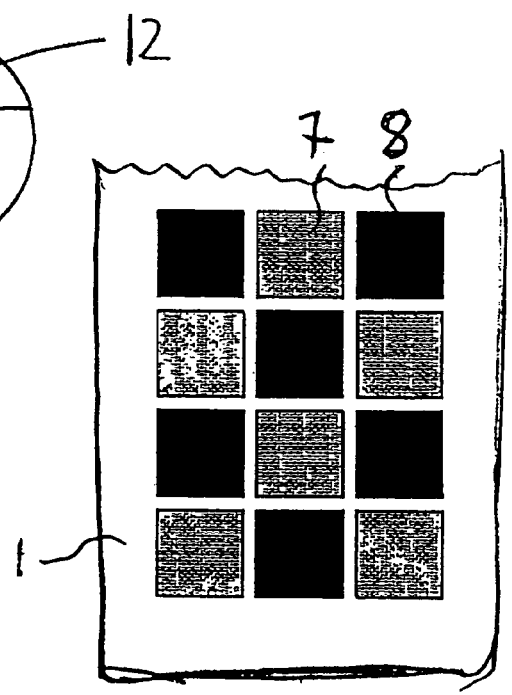
FIG. 3 shows a possible pattern of sensors arranged in accordance with one embodiment of the present invention.

1 while another electrode could be placed on the opposite side surface of the mobile station or on the back or front surface of the mobile station It may be difficult in some instances to measure the GSR response by only two electrodes, for example because different users tend to hold the mobile station in different ways. Therefore it may be advantageous to provide the terminal with more than two electrodes. The electrodes may also be positioned in an appropriate array. FIG. 3 shows one possibility for such an array, even though there are various different alternatives for this. The array of the electrodes could be placed, for example, on the back surface of the mobile station.

Figure 4:
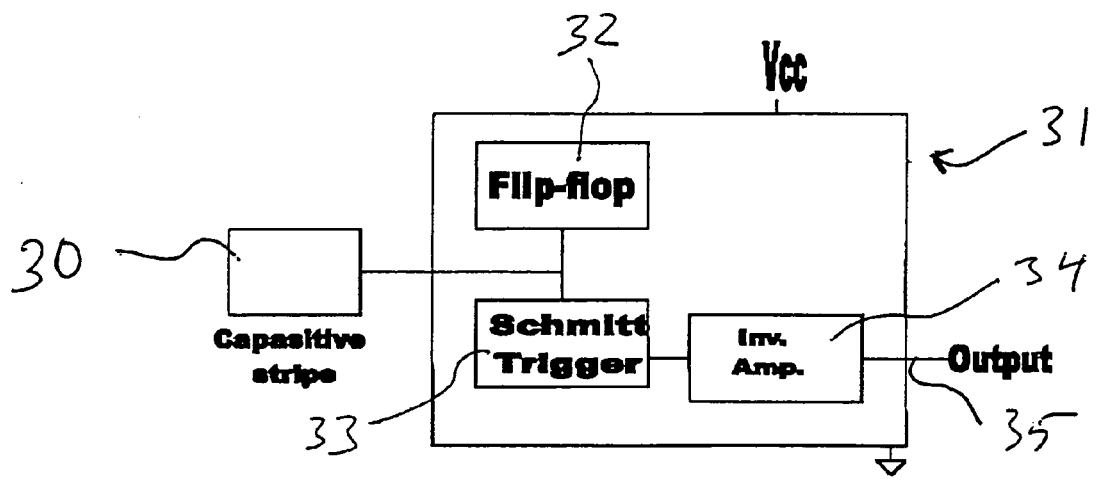
FIG. 4 is a schematic illustration of capacitive proximity sensor circuitry.

FIG. 4 illustrates a possible arrangement for the second arrangement for measuring the presence of the living tissue in touch or in close proximity with the terminal. More particularly, a capacitive proximity (CP) sensor arrangement is shown by FIG. 4. The capacitive proximity sensor requires only one electrode, even though it is possible to use several CP sensors. The CP based system can be adjusted to sense the proximity of the living tissue, for example such that a CP sensing arrangement will react when the distance between the skin of the user and the mobile station is within a range of 0 to 5 mm. The capacitive proximity sensors may be arranged to be sensitive only for living tissue, and will thus not react to other materials. When the capacitive proximity sensor senses a living tissue, it may output an appropriate signal, such as a TTL level signal. The use of the TTL level output signal in accordance with the invention was already discussed above.

FIG. 4 shows a schematic block diagram for a detection circuitry 31 based on the capacitive proximity sensor detection. In general, the circuitry 31 can be defined as oscillating circuitry that is implemented by means of a flip-flop switch 32. The circuitry 31 is provided with suitable triggering means 33, such as a Schmitt trigger. An inverting amplifier 34 may also be provided on the output line 35. The circuitry operates such that when the capacitive sensor 30 is touched by a living tissue, the output on line 35 will rise in the Vcc level, thus providing a signal indicating that the terminal is in touch with living tissue.

The capacitive proximity (CP) sensor may also detect a living tissue, such as the skin of the user, that is not in an direct contact with the sensors. The skin may be, for example, within a distance that is up to 5 mm from the sensing electrode. Therefore the capacitive proximity electrode 30 may be placed on the internal surface of the cover material of the terminal 1 or may be embedded within the cover material of the terminal 1. For example, it could be placed inside the cover of the battery 10 of the mobile terminal 1.

Figures 5, 6:
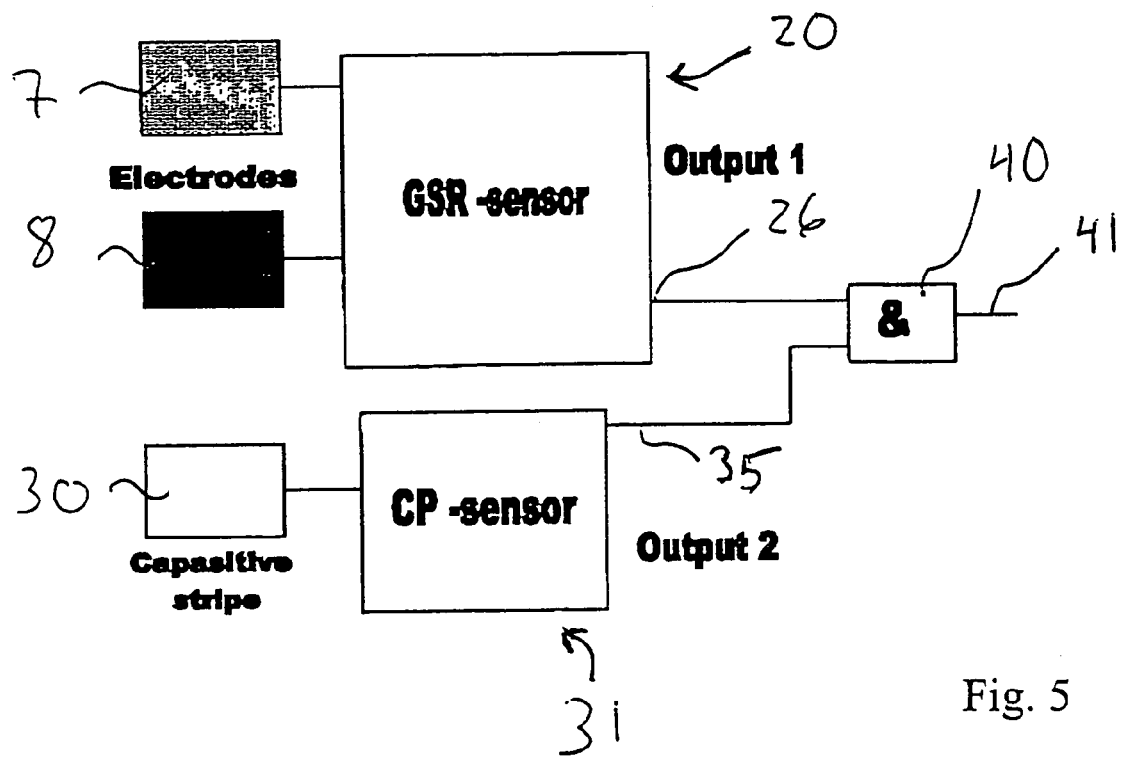
FIG. 5 shows a block chart of an automated keyboard lock arrangement.
FIG. 6 is a flowchart of the operation in accordance with one embodiment of the present invention.

FIG. 5 illustrates a detector arrangement by means of which it is possible to improve the reliability of the detection. The improved arrangement is adapted to verify and combine the detection results by employing more than one sensing technique in the generation of the output signal 41 to make sure that the terminal is indeed in the hand of the user or against the cheek or ear of the user.

More particularly, FIG. 5 shows an embodiment in which the output signals of the above discussed two different sensing techniques are combined at block 40 prior a signal on line 41 is inputted into the controller of the terminal. The arrangement of FIG. 5 is preferably such that an output signal 41 is provided by a combiner 40 only when both the galvanic skin response circuitry 20 and the capacitive proximity circuitry 31 provide a positive TTL level output signal to the combiner 40. By employing both the galvanic skin response and the capacitive proximity method in the same terminal it is possible to decrease the risk for incorrect signals and thus improve the reliability of the detection arrangement.

As illustrated by the flow chart of FIG. 6, the output signals on lines 26 and 35 may be used in the control of a function of the mobile station. For example, activation of a mobile station that is in a standby mode may be based on the output signal on line 41 from the sensing arrangement. The activation of the mobile station may be triggered by the control unit 12 of the mobile station based on a received TTL level signal output 26 from the GSR arrangement 20 and a CP signal from the arrangement 31. The mobile station may be correspondingly deactivated i.e. returned to the standby mode after the control unit no longer receives the signal from block 40. An automated keyboard lock may function in a corresponding manner, i.e. the keyboard may be unlocked only when a signal ids output from the block 40. The station may also be switched between different modes of operation or even on and off based on the output signal received from the detecting means. The lighting of the keypad and/or the display may be controlled based on this information. According to an example, a vibrating alarm arrangement of the mobile station is controlled such that no sound alarm is provided when the mobile station is detected to be in contact with the skin of the user, while a sound alarm will be provided when the mobile station (or any part or accessory thereof) is not in direct contact with the skin of the user.

It is to be noted that the above functions described in the context of a mobile station are only examples and that the embodiments of the present invention may be employed when controlling any function of a communications terminal. It is also noted that the output signal from the detector arrangement may indicate a "positive" or "negative" contact. In other words, a signal may be outputted only when the terminal is in contact with the skin of the user or alternatively only when there is no contact between the user and the terminal.

In addition to the above described two techniques for sensing the presence of human skin, it is possible to use other sensing techniques for providing an output signal indicating whether the terminal or a part thereof is in contact with a part of human body. For example, one or several pressure sensors may be employed. Instead of just sensing any pressure subjected to the terminal, the pressure sensing arrangement may also be adapted to detect a predefined pressure pattern caused by a human hand. The pressure sensor may be, for example, a piezoelectric film or made from an elasto resistive material and so on. According to one alternative the terminal may be provided with means for sensing a change in the temperature of the cover material. That is, to sense a change in temperature that is caused by the hand of the user. A sensing arrangement may also detect a predefined temperature pattern on the surface of the terminal. The shape of the hand and/or the fingers may be adapted to cause a specific pattern that is detectable by appropriate sensing means. Suitable temperature sensor and sensor arrays are known, and will thus not be explained in more detail. Preferred temperature sensors comprise sensors arranged to detect fast predetermined changes in temperature.

According to an alternative the mobile station or some parts thereof may be covered with an electrically conductive material, such as a metallic coating, and an appropriate isolation is provided between the various parts of the cover. The material of the housing 11 itself may be made from a conductive material. Thus the housing 11 of the mobile station 1 may also be used as a sensing electrode of a contact detection arrangement.

According to an embodiment the galvanic skin response sensor is arranged also to detect pressure. This is enabled by the realization that the electric conductivity will increase when the user takes a harder grip of the handset, i.e. presses the handset harder within his hand.

According to an alternative the pressure sensing by any appropriate pressure sensing means may be used for giving control instructions to the terminal, such as for confirming a selection suggested by the terminal. For example, when the user has to confirm that he wishes to proceed with a suggestion displayed to him by the display he may just grip harder on the terminal and the controller of the terminal will subsequently perform the suggested operation. A further example relates to such short text message implementations where a mobile station may suggest a word. In this application the user may confirm the use of the suggested word simply by pressing the phone harder. In other words, the sensing arrangement of the invention may also be used for giving feedback and instructions to the communications terminal.

According to an embodiment the sensitivity of the sensing means of at least one of the detector arrangements is adjustable. This may be implemented, for example, by providing the circuitry 20 of FIG. 2 with an adjustable threshold level component 22. In addition, the sensitivity of the control unit of the mobile station can be adjusted in accordance with specific requirements and/or conditions and may vary if the requirements and/or conditions change. According to an embodiment other information may also be employed when providing the control of a function of the terminal. For example, it may be desired to be able to adjust the sensitivity in accordance with the changed temperature conditions, as a cold hand is less conductive than a warm (and thus sweaty) hand. The controller may provide different instructions for the controlled functions depending the location or the context where the control is provided. For example, during a normal speech call the lighting of the display and/or keyboard may be switched off after a predefined time has lapsed from the activation thereof. However, the lightning will stay on if the connection was established for data communication, such as for a wireless application protocol (WAP) connection or for an Internet connection. At least one of the sensing arrangements may also be adapted such that it will take changes in the time of the day and/or seasons of the year or changes in the conductivity of the components used for the sensors into account. The adjustment may also be adaptive so that the controller may itself adjust the operation thereof to be within certain predefined parameters. This may be implemented by means of statistical analysis that are made for a predefined data over time.

It should be appreciated that whilst embodiments of the present invention have been described above in relation to mobile stations, embodiments of the present invention are applicable to any other suitable type of communication user equipment, such as fixed land line terminals and any parts or accessories of the terminals. The accessories include devices such as earpieces, headsets, handsets and keyboards that are operationally connected to the terminal.

It is also noted herein that while the above describes exemplifying embodiments of the invention, there are several variations and modifications which may be made to disclosed solution without departing from the scope of the present invention as defined in the appended claims.

The invention claimed is:

1. A terminal for a communication system, the terminal comprising a first detector arrangement and a second detector arrangement, said first and second detector arrangements being based on different principles of detecting a contact between at least one surface of the terminal and the skin of the user of the terminal, wherein at least one function of the terminal is controlled based on signals from the first and second detector arrangements, and a control operation is provided only if said first and second detector arrangements both output a signal that indicates a contact between the terminal and the skin of the user.

2. A terminal according to claim 1 comprising a controller for controlling said at least one function of the terminal.

3. A terminal according to claim 2, wherein the controller is adjustable so that the controller provides different control instructions for the function controlled by the controller depending on the settings of the controller.

4. A terminal according to claim 1, wherein switching between different modes of operation of the terminal is arranged to be triggered based on signals from the detector arrangements.

5. A terminal according to claim 4, wherein the terminal is switched between a standby mode and an active mode.

6. A terminal according to claim 1, wherein a keypad lock of the terminal is operated based on signals from the detector arrangements.

7. A terminal according to claim 1, wherein the operation of a display of the terminal is controlled based on signals from the detector arrangements.

8. A terminal according to claim 1, wherein the operation of an alarm producing means is controlled based on signals from the detector arrangements.

9. A terminal according to claim 1, wherein the detector arrangements are arranged to sense a contact between the terminal and the hand of the user.

10. A terminal according to claim 1, wherein the detector arrangements are arranged to sense a contact between the terminal and the cheek and/or ear of the user.

11. A terminal according to claim 1, wherein one of the detector arrangements comprises a galvanic skin response detection arrangement.

12. A terminal according to claim 11, wherein the galvanic skin response detection arrangement is adapted to detect a gripping pressure caused by the hand of the user of the terminal.

13. A teriuinal according to claim 1, wherein one of the detector arrangements is arranged to detect a pressure caused by the hand of the user.

14. A terminal according to claim 13, wherein a predefined pressure pattern is arranged to be detected.

15. A terminal according to claim 1, wherein one of the detector arrangements comprises a capacitive proximity sensor.

16. A terminal according to claim 15, wherein the capacitive proximity sensor is placed on the inner surface of a cover of the terminal or an accessory thereof.

17. A terminal according to claim 1, wherein at least a part of at least one detector arrangement is provided in a detachable part of the terminal.

18. A terminal according to claim 1, wherein at least one 0f the detector arrangements is integrated in the cover material of the terminal.

19. A terminal according to claim 1, wherein at least one of the detector arrangements comprises at least three sensor elements, said at least three sensor elements being arranged in an array on the surf ace of the terminal.

20. A terminal according to claim 1, wherein the control of the function is based on adaptive use of the information provided by the signals from the detector arrangements.

21. A terminal according to claim 1, wherein the sensitivity of at least one of the detector arrangements is adjustable.

22. A terminal according to claim 1, wherein the control of the function is based, in addition to signals from the detector arrangements, on at least one of the following: the operational status of the terminal; the location of the terminal; the time of the day; the time of the year; temperature; the type of the communication.

23. A terminal according to claim 1, wherein at least one of the detector arrangements is provided in a handset or headset of the terminal.

24. A terminal according to claim 1, wherein the terminal comprises a mobile station of a radio communication system.

25. A detector arrangement for a terminal of a communication system, the terminal comprising at least one element that is to be held against the skin of the user of the terminal, the detector arrangement comprising a first detector arrangement and a second detector arrangement, said first and second detector arrangements being based on different principles of detecting a contact between the terminal and the skin of the user, and circuitry adapted for generating an output signal based on signals from the first and second detector arrangements when the terminal touches in a predefined manner the skin of the user, the output signal being arranged to be employed in the control of at least one function of the terminal, wherein the output signal is provided only if said first and second detector arrangements both output a signal that indicates a contact between the terminal and the skin of the user.

26. A method of controlling at least one function of a terminal of a communication system, comprising the steps of:
   detecting a contact between the terminal and the skin of the user of the terminal by means of a first detector arrangement;
   detecting a contact between the terminal and the skin of the user of the terminal by means of a second detector arrangement, said second detector arrangement being different from the operational principles thereof from the first detector arrangement;
   based on signals from the first and second detector arrangements, generating en output signal indicating that the surface of the terminal is in contact with the skin of the user; and
   controlling said at least one function of the terminal based on the output signal;
   wherein the generation of the output signal comprises steps of:
   receiving signals from the first and second detector arrangements; and
   generating the output signal only if said first and second signals indicate similar detection result.

27. An apparatus for controlling at least one function of a terminal of a communication system, comprising:
   first means for detecting a contact between the terminal and the skin of a user of the terminal;
   second means for detecting a contact between the terminal and the skin of the user of the terminal, the second means being different from the first means in operational principle;
   means for receiving signals from the first and second detecting means and generating an output signal indicating that the surface of the terminal is in contact with the skin of the user only if the signals from the first and second detecting means indicate a similar detection result;
   means for controlling at least one function of the terminal based on the output signal.

28. A terminal for a communication system, the terminal comprising a first detector arrangement and a second detector arrangement, said first and second detector arrangements being based on different principles of detecting a contact between at least one surface of the terminal and the skin of the user of the terminal, wherein at least one function of the terminal is controlled based on signals from the first arid second detector arrangements, and a control operation is provided only if said first and second detector arrangements both output a signal that indicates a contact between the terminal and the skin of the user, wherein at least one of the detector arrangements is integrated in cover material of the terminal.

* * * * *

UNITED STATES PATENT AND TRADEMARK OFFICE
CERTIFICATE OF CORRECTION

PATENT NO. : 7,212,835 B2
APPLICATION NO. : 09/737033
DATED : May 1, 2007
INVENTOR(S) : Jani Antero Mantyjarvi It is certified that error appears in the above-identified patent and that said Letters Patent is hereby corrected as shown below:

In column 8, line 47, in claim 13, delete "teriuinal" and insert --terminal--, therefor.

In column 8, line 62, in claim 18, delete "0f" and insert --of--, therefor.

In column 8, line 67, in claim 19, delete "surf ace" and insert --surface--, therefor.

In column 10, line 4, in claim 26, delete "en" and insert --an--, therefor.

In column 10, line 37, in claim 28, delete "arid" and insert --and--, therefor.

Signed and Sealed this

Twenty-sixth Day of February, 2008

JON W. DUDAS
*Director of the United States Patent and Trademark Office*